(12) United States Patent
Allee

(10) Patent No.: US 10,338,616 B2
(45) Date of Patent: Jul. 2, 2019

(54) REFERENCE GENERATION CIRCUIT

(71) Applicant: Microsemi Semiconductor (U.S.) Inc., Austin, TX (US)

(72) Inventor: Daren Allee, Austin, TX (US)

(73) Assignee: Microsemi Semiconductor (U.S.) Inc., Austin, TX (US)

( * ) Notice: Subject to any disclaimer, the term of this patent is extended or adjusted under 35 U.S.C. 154(b) by 0 days.

(21) Appl. No.: 16/171,245

(22) Filed: Oct. 25, 2018

(65) Prior Publication Data
US 2019/0138040 A1 May 9, 2019

Related U.S. Application Data

(60) Provisional application No. 62/583,507, filed on Nov. 9, 2017.

(51) Int. Cl.
*G05F 1/56* (2006.01)
*G05F 1/567* (2006.01)
*H03K 17/687* (2006.01)
*G05F 1/575* (2006.01)

(52) U.S. Cl.
CPC ............. *G05F 1/567* (2013.01); *G05F 1/575* (2013.01); *H03K 17/687* (2013.01)

(58) Field of Classification Search
CPC ... G05F 1/46; G05F 1/56; G05F 1/565; G05F 1/567; G05F 1/569; G05F 1/575; G05F 1/59; H03K 17/56; H03K 17/687
See application file for complete search history.

(56) References Cited

U.S. PATENT DOCUMENTS 8,390,491 B2 * 3/2013 Wakimoto ............... G05F 1/56
323/312
2005/0237105 A1 * 10/2005 Park ..................... G05F 3/30
327/539

(Continued)

OTHER PUBLICATIONS

Ribeiro, et al., "A Bandgap Voltage Reference With Only MOS Transistors," Instituto de Telecomunicações/Instituto Superior Técnico, Technical University of Lisbon, Lisboa, Portugal.

(Continued)

*Primary Examiner* — Matthew V Nguyen
(74) *Attorney, Agent, or Firm* — Glass and Associates; Kenneth Glass

(57) ABSTRACT

A reference circuit constituted of: a voltage/current bias circuitry; a first transistor coupled between a common voltage and an first bias circuitry output; a second transistor coupled between the common voltage and a second bias circuitry output; a third transistor coupled between the common voltage and an output providing a temperature and supply invariant current; a resistor coupled between the second transistor and the second output of the bias circuitry; and an output providing a temperature and supply invariant voltage coupled between the resistor and the second transistor, the voltage output terminal further coupled to a gate of the third transistor, wherein the bias circuitry is arranged, in cooperation with the first transistor, to generate a first current at the first output thereof, and, in cooperation with the second transistor, to generate a second current at the second output thereof, the current magnitudes exhibiting a ratio of a predetermined value.

16 Claims, 3 Drawing Sheets

(56) References Cited

U.S. PATENT DOCUMENTS

2016/0252923 A1\* 9/2016 Nien .................. G05F 3/262
                                                 323/313
2017/0153659 A1\* 6/2017 Quelen ................ G05F 3/242

OTHER PUBLICATIONS

Hongprasit, et al., "Design of Bandgap Core and Startup Circuits for All CMOS Bandgap Voltage Reference," Przeglad Elektrotechniczny (Electrical Review), ISSN 0033-2097, R. 88 NR 4a, 2012.

\* cited by examiner

REFERENCE GENERATION CIRCUIT

TECHNICAL FIELD

The present invention relates to the field of reference circuits and in particular to a reference generation circuit exhibiting a voltage and current output.

BACKGROUND

A bandgap circuit is a circuit which provides a fixed voltage or current, regardless of power supply variations and temperature changes. Typically, bandgap circuits are composed of bipolar junction transistors (BJTs), which are not generally suitable for small, low cost, integrated circuits. There have been attempts at designing metal-oxide-semiconductor field-effect-transistor (MOSFET) based bandgap circuits, however the temperature variations of MOSFETs are far more complex than those of BJTs and it is difficult to trim. Additionally, as with prior art BJT based bandgap circuits, only one of a fixed current and a fixed voltage are provided, thereby requiring a very precise and temperature-invariant resistor to provide a fixed voltage/current ratio.

What is desired, and not provided by the prior art, is a circuit which can utilize FET technology and that provides a fixed voltage/current ratio.

SUMMARY OF THE INVENTION

Accordingly, it is a principal object of the present invention to overcome at least some of the disadvantages of prior art bandgap circuits. This is provided in one embodiment by a reference generation circuit comprising: a first output providing a temperature and supply invariant voltage, and a second output providing a temperature and supply invariant current; a first transistor sourced by a common voltage rail, the first transistor sharing a gate and drain connection with a first output of a voltage/current biasing circuitry; a second transistor also sourced by the common voltage rail, the second transistor sharing a gate and drain connection with the first voltage output terminal; a resistor coupled between this second transistor and a second output of the voltage/current bias circuitry; a third transistor also sourced by the common voltage rail, whose gate is connected to the first voltage output terminal to create the second current output terminal at the drain thereof, wherein the voltage/current bias circuitry is arranged to generate a first current and voltage at the first output thereof and a second current and voltage at the second output thereof, the magnitude of the first current equal to the magnitude of the second current times a predetermined value, the predetermined value different than one, the magnitude of the first voltage equal to the magnitude of the second voltage, and wherein the magnitude of a third current flowing through the third transistor is a predetermined function of the magnitude of the second current. In the preferred implementation, the voltage potential at the second output of the reference generation circuit can be biased to be substantially equal to the voltage potential at the first output so that the second output provides a cascaded current source.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding sections or elements throughout. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

Figure 1:
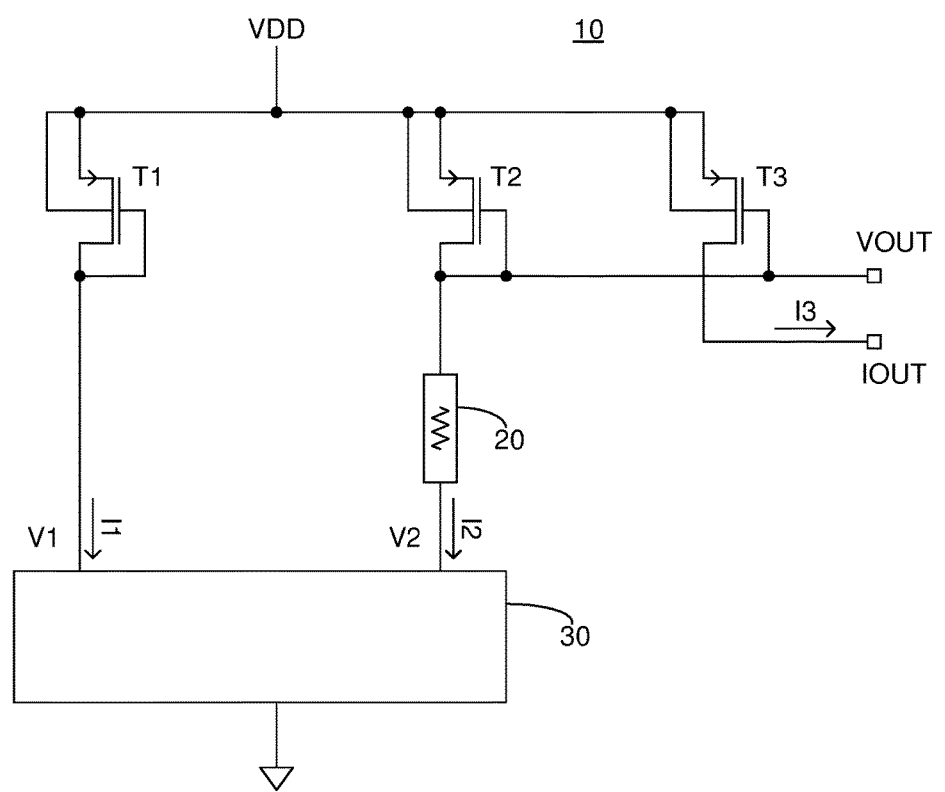
FIG. 1 illustrates a high level schematic diagram of a FET based bandgap circuit, according to certain embodiments.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a high level schematic diagram of a FET based bandgap circuit 10, according to certain embodiments. Reference circuit 10 comprises: a plurality of field effect transistors, denoted T1, T2 and T3, respectively; a resistor 20; a voltage/current bias circuitry 30; a current output terminal, denoted IOUT; and a voltage output terminal, denoted VOUT. In one embodiment, each of transistors T1, T2 and T3 is a p-channel metal-oxide-semiconductor FET (PFET), and is described herein as such. In one preferred embodiment, PFETs T1, T2 and T3 are matched so as to exhibit the same physical properties. In another embodiment, as will be described below in relation to FIG. 2, resistor 20 comprises a tunable resistor. In one further embodiment, non-limiting embodiment, tunable resistor 20 comprises a p+ diffusion leg and an n-well leg.

The source and body of each of PFETs T1, T2 and T3 are respectively coupled to a voltage rail, denoted VDD. The gate of PFET T1 is coupled to the drain thereof and to a first output of voltage/current bias circuitry 30. The gate of PFET T2 is coupled to the drain of PFET T2, a first end of resistor 20, the gate of PFET T3 and voltage output terminal VOUT. The drain of PFET T3 is coupled to current output terminal IOUT. A second end of resistor 20 is coupled to a second output of voltage/current bias circuitry 30.

In operation, voltage/current bias circuitry 30 generates, in cooperation with PFET T1, a first voltage and current at the first output thereof, the first current denoted I1. Voltage/current bias circuitry 30 further generates, in cooperation with PFET T2, a second current at the second output thereof, the second current denoted I2. The magnitude of current I1 is a linear function of the magnitude of current I2. Particularly, the magnitude of current I1 is equal to the magnitude of current I2 multiplied by a predetermined value, the predetermined value being different than 1. Additionally, voltage/current bias circuitry 30 controls the voltage at the first output thereof, denoted V1, to be equal to the voltage at the second output thereof, denoted V2. The relationship between the magnitudes of currents I1 and I2 and the properties and voltages of PFETs T1 and T2 is given as:

$$I_D = \beta*(V_{GS}-V_T)^2 \qquad \text{EQ. 1}$$

where $\beta$ is a variable based on the physical properties of the respective PFET, $V_{GS}$ is the gate-source voltage of the respective PFET and $V_T$ is the threshold voltage of the respective PFET. In the preferred embodiment, where PFETs T1 and T2 are matched, $\beta$ and $V_T$ of PFETs T1 and T2 are equal to each other. Thus, the magnitude of current I2, denoted $I2_D$, is given as:

$$I2_D = \beta*(V_{GS2}-V_T)^2 \qquad \text{EQ. 2}$$

where $V_{GS2}$ is the gate-source voltage of PFET T2, and the magnitude of current I1, denoted $I1_D$, is given as:

$$I1_D = \beta*(C_{GS1}-V_T)^2 \qquad \text{EQ. 3}$$

where $V_{GS1}$ is the gate-source voltage of PFET T1.

EQ. 3 can be rewritten as:

$$N*I2_D = \beta*(V_{GS2}+\Delta V_{GS}-V_T)^2 \qquad \text{EQ. 4}$$

where N is the linear relation between the current magnitudes $I1_D$ and $I2_D$ set by voltage/current bias circuit 30, and $\Delta V_{GS}$ is equal to $V_{GS1}-V_{GS2}$. EQ. 4 can be rewritten as:

$$N*I2_D = \beta*(V_{GS2}-V_T)^2 + \beta*\Delta V_{GS}(2(V_{GS2}-V_T)+\Delta V_{GS}) \qquad \text{EQ. 5}$$

Combining EQs. 2 and 5, we get:

$$N*I2_D = I2_D + \beta*\Delta V_{GS}((V_{GS2}-V_T)+(V_{GS2}-V_T)+\Delta V_{GS}) \qquad \text{EQ. 6}$$

and combining EQs. 2, 4 and 6, we get:

$$(N-1)*I2_D = \beta*\Delta V_{GS}((I2_D/\beta)^{1/2}+(N*I2_D/\beta)^{1/2}) \qquad \text{EQ. 7}$$

which can be rewritten as:

$$(N-1)*I2_D = \beta*\Delta V_{GS}(1+N^{1/2})*(I2_D/\beta)^{1/2} \qquad \text{EQ. 8}$$

which can further be rewritten as:

$$(I2_D)^{1/2} = \Delta V_{GS}*\beta^{1/2}(1+N^{1/2})/(N-1) \qquad \text{EQ. 9}$$

Squaring both sides of the equation, EQ. 9 can be rewritten as:

$$I2_D = \Delta V_{GS}^2 \beta(1+N^{1/2})^2/(N-1)^2 \qquad \text{EQ. 10}$$

Since, as indicated above, voltages V1 and V2 are equal, $\Delta V_{GS}$ can be given as:

$$\Delta V_{GS} = I2_D * R \qquad \text{EQ. 11}$$

where R is the resistance of resistor 20.

Combining EQs. 10 and 11, we get:

$$I2_D = I2_D^2 * R^2 \beta(1+N^{1/2})^2/(N-1)^2 \qquad \text{EQ. 12}$$

Dividing both sides of the equation with $I2_D$, EQ. 12 can be rewritten as:

$$1 = I2_D * R^2 \beta(1+N^{1/2})^2/(N-1)^2 \qquad \text{EQ. 13}$$

which can be rewritten as:

$$I2_D = (N-1)^2/(R^2 \beta(1+N^{1/2})^2) \qquad \text{EQ. 14}$$

As shown by EQs. 12-14, the magnitude $I2_D$ of current I2 is a fixed predetermined function of $\beta$, R and N. As a result, in the preferred embodiment where PFET T3 is matched to PFET T2, the magnitude of the current I3 of PFET T3, denoted $I3_D$, is equal to the magnitude $I2_D$ of current I2. Thus, the magnitude $I3_D$ of current I3, which is output at current output IOUT, is a fixed predetermined function of $\beta$, R and N.

Additionally, EQ. 2 can be rewritten as:

$$(I2_D/\beta) = (V_{GS2}-V_T)^2 \qquad \text{EQ. 15}$$

which can further be written as:

$$V_{GS2} = V_T + (I2_D/\beta)^{1/2} \qquad \text{EQ. 16}$$

Thus, the difference between VDD and VOUT is independent of VDD, and is given as:

$$VDD - VOUT = -(V_T + (I2_D/\beta)^{1/2}) \qquad \text{EQ. 17}$$

As described above, $I2_D$ is a fixed predetermined function of $\beta$, R and N. Therefore, the difference between VDD and VOUT is a fixed predetermined function of $\beta$, $V_T$, R and N.

Based on EQ. 14, the temperature differential equation of current $I2_D$ can be written as:

$$\delta/\delta T(I2_D) = ((N-1)^2/(1+N^{1/2})^2)(-\delta/\delta T(\beta)/(R^2\beta^2) - 2\delta/\delta T(R)/(R^3(\beta))) \qquad \text{EQ. 18}$$

To arrive at a zero temperature differential for current $I2_D$, we should have:

$$((N-1)^2/(1+N^{1/2})^2)(-\delta/\delta T(\beta)/(R^2\beta^2) - 2\delta/\delta T(R)/(R^3\beta)) = 0 \qquad \text{EQ. 19}$$

which can be rewritten as:

$$\delta/\delta T(\beta)/\beta = -2\delta/\delta T(R)/R \qquad \text{EQ. 20}$$

Thus, PFETs T1 and T2, and the type of resistor 20, are selected such that EQ. 20 is met. As a result, the magnitude of current I2, and therefore the magnitude of current I3, will not be affected by changes in temperature. $(\delta/\delta T(R)/R)$ is the temperature coefficient of resistance and can be found in the electrical specifications of resistor 20. Different PFETs T1 and T2 can be analyzed with resistor 20 specifications to find an ideal set of components to meet EQ. 20.

Based on EQ. 16, the temperature differential equation of $V_{GS2}$ can be written as:

$$\delta/\delta T(V_{GS2}) = \delta/\delta T(V_T) - \delta/\delta T(\beta)(I2_D^{1/2}/\beta^{3/2}) + \delta/\delta T(I2_D)/(I2_D^{1/2}\beta^{1/2}) \qquad \text{EQ. 21}$$

To arrive at a zero-temperature differential for voltage magnitude $V_{GS2}$, we have:

$$\delta/\delta T(V_T) - \delta/\delta T(\beta)(I2_D^{1/2}/\beta^{3/2}) + \delta/\delta T(I2_D)/(I2_D^{1/2}\beta^{1/2}) = 0 \qquad \text{EQ. 22}$$

As described above, $\delta/\delta T(I2_D)$ equals zero, thus EQ. 22 can be rewritten as:

$$\delta/\delta T(V_T) = \delta/\delta T(\beta)(I2_D^{1/2}/\beta^{3/2}) \qquad \text{EQ. 23}$$

Combining EQ. 23 with EQ. 20, we get:

$$\delta/\delta T(V_T) = (-2\delta/\delta T(R)/R) * (I2_D^{1/2}/\beta^{1/2}) \qquad \text{EQ. 24}$$

and combining EQ. 24 with EQ. 14, we get:

$$\delta/\delta T(V_T) = (-2\delta/\delta T(R)/R) * ((N-1)/(R*\beta*(1+N^{1/2}))) \qquad \text{EQ. 25}$$

$\delta/\delta T(V_T)$ can be found in the electrical specifications of PFETs T1 and T2. Similarly, as described above, $(\delta/\delta T(R)/R)$ can also be found in the electrical specification of resistor 20. Thus, EQ. 25 provides a simple equation for a temperature independent (VDD−VOUT). In summary, EQs. 14, 17, 20 and 25 provide predetermined relationships for achieving an output current I3 and an output voltage (VDD−VOUT) which are independent of fluctuations in temperature and fluctuations of rail voltage VDD. In the embodiment where resistor 20 is a tunable resistor, resistor 20 can be tuned such that in practice the temperature fluctuations of ((VDD−VOUT)/I3) are minimal, even if the conditions of EQs. 20 and 25 are not precisely met. In one preferred embodiment, resistor 20 is tuned during calibration to a value such that variation of the ratio of ((VDD−VOUT)/I3), over the temperature range of −30° C. to 95° C., is less than 1%. Tunable resistor 20 is preferably a PMOS resistor. In one embodiment tunable resistor 20 is a linear tunable resistor.

The above has been described in an embodiment where transistor T1, T2 and T3 are coupled to VDD, however this is not meant to be limiting in any way. In another embodiment, transistors T1, T2 and T3 are coupled to the common potential and VOUT is presented in relation to the common potential.

Figure 2:
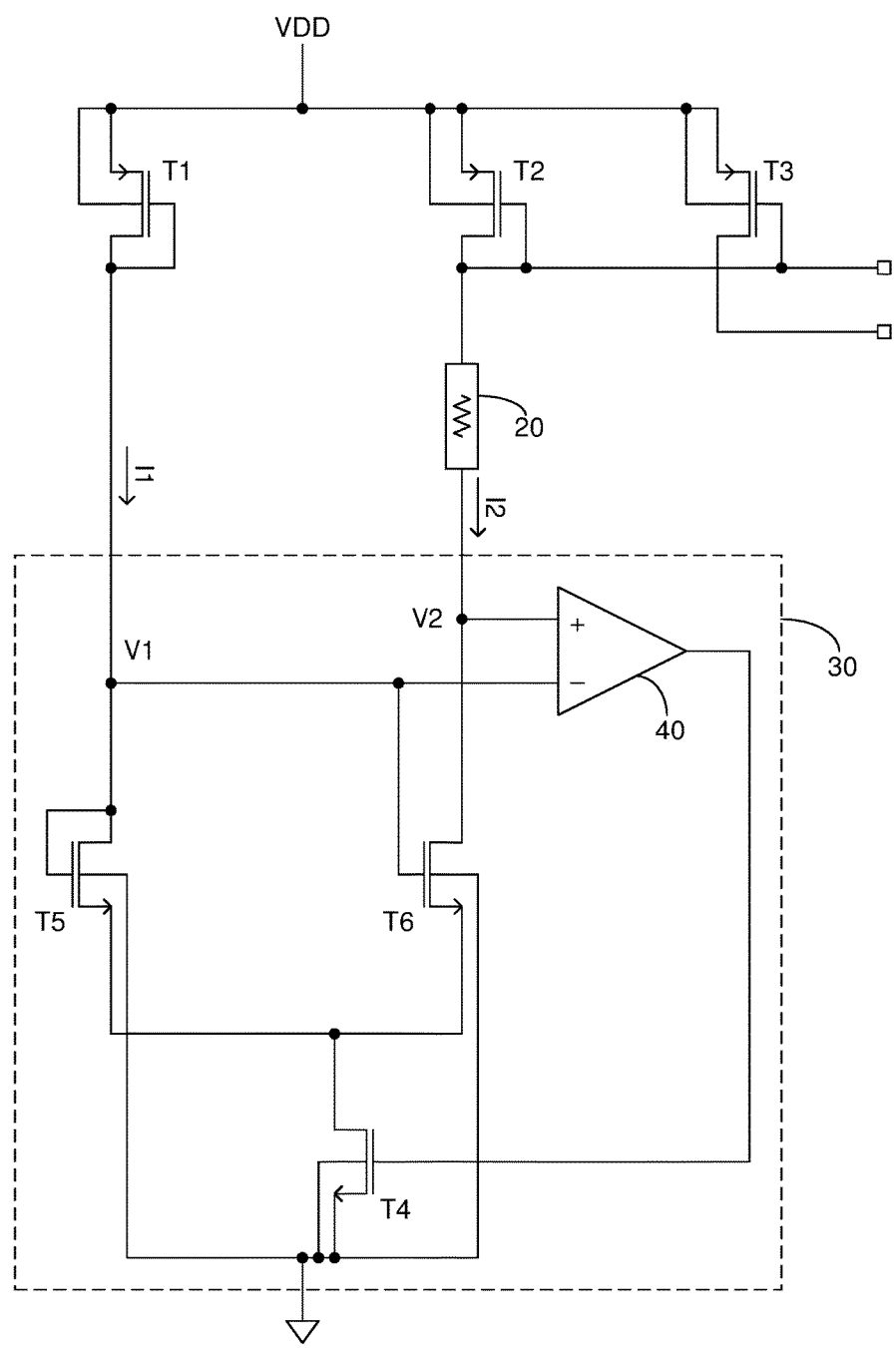
FIG. 2 illustrates a more detailed schematic diagram of the FET based bandgap circuit of FIG. 1, according to certain embodiments.

FIG. 2 illustrates a more detailed schematic diagram of FET based reference circuit 10, particularly providing more details of voltage/current bias circuitry 30. Specifically, voltage/current bias circuitry 30 comprises: a voltage control transistor T4; a non-resistance side transistor T5; a resistance side transistor T6; and a differential amplifier 40. In one embodiment, each of voltage control transistor T4, non-resistance side transistor T5 and resistance side transistor T6 is an n-channel metal-oxide-semiconductor FET (NFET), and will be described herein as such. The drain of PFET T1 is coupled to the gate and the drain of NFET T5, via the first output of voltage/current bias circuitry 30, and is further coupled to the inverting input of differential amplifier 40 and the gate of NFET T6. The source of NFET T5 is coupled to the source of NFET T6 and the drain of NFET T4. The drain of NFET T6 is coupled to the non-inverting input of differential amplifier 40 and the second end of resistor 20, via the second output of voltage/current bias circuitry 30. As described above, the first end of resistor 20 is coupled to the drain of PFET T2 and to the gates of PFETs T2 and T3. The output of differential amplifier 40 is coupled to the gate of NFET T4. The source of NFET T4, and the body terminals of NFETs T4, T5 and T6 are each coupled to the common potential.

In operation, as described above, voltage/current bias circuitry 30 generates, in cooperation with PFET T1, a first current I1. Voltage/current bias circuitry 30 further generates, in cooperation with PFET T2, a second current I2, the magnitude of current I1 being equal to a multiplication of the magnitude of current I2 by the predetermined value, as will be described further below. Additionally, voltages V1 and V2 at the outputs thereof are arranged to be equal. Particularly, voltages V1 and V2 are controlled to be equal by the feedback loop of differential amplifier 40 and NFET T4, i.e. differential amplifier 40 controls the magnitude of the current of NFET T4 such that voltages V1 and V2 are equal to each other, as known to those skilled in the art at the time of the invention.

The ratio of the areas of NFETs T5 and T6 is selected such that the ratio of the magnitudes of currents I1 and I2 equals the predetermined value. As described above, the predetermined relationships between the properties of resistor 20 and PFETs T1 and T2 cause the magnitude of current I2 to be nearly independent of temperature and VDD fluctuations.

Figure 3:
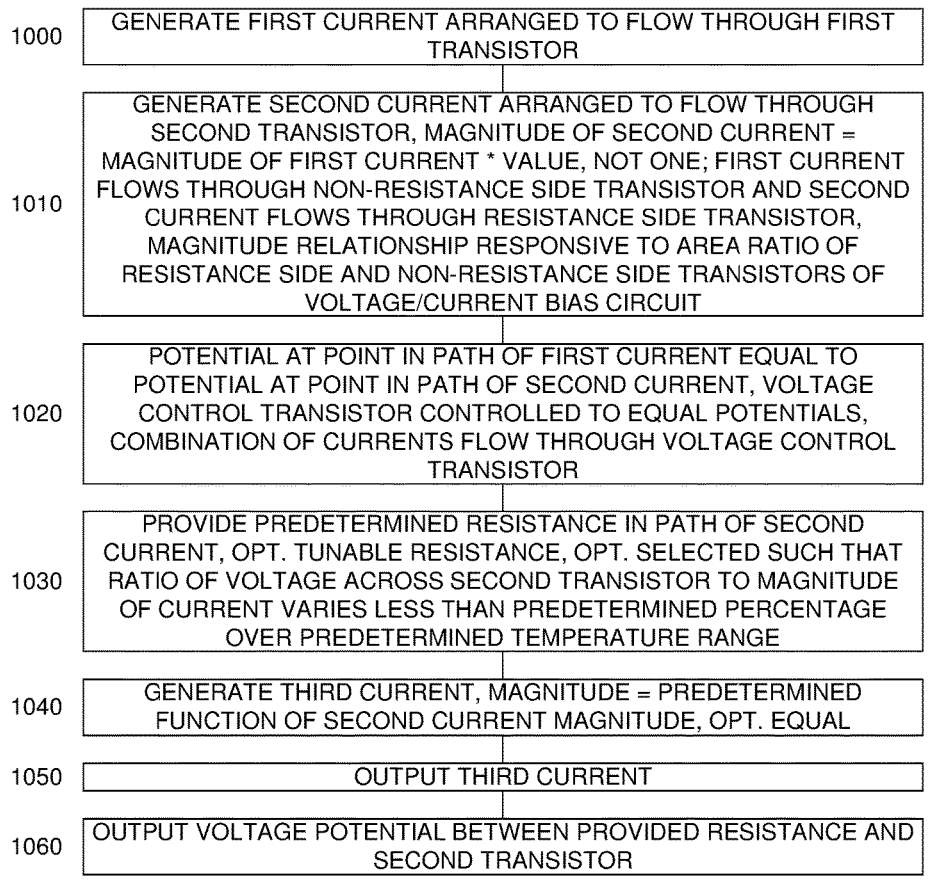
FIG. 3 illustrates a high level flow chart of a method of providing a fixed voltage to current ratio, according to certain embodiments.

FIG. 3 illustrates a high level flow chart of a reference generation method, according to certain embodiments. In stage 1000, a first current is generated, the generated first current arranged to flow through a first transistor. In one embodiment, the first transistor is a MOSFET. In stage 1010, a second current is generated, the generated second current arranged to flow through a second transistor. In one embodiment, the second transistor is a MOSFET. The magnitude of the first current of stage 1000 is equal to the magnitude of the second current multiplied by a predetermined value. The predetermined value is different than one, i.e. the magnitudes of the first and second currents are not equal. The first current further flows through a non-resistance side transistor and the second current flows through a resistance side transistor. The relationship between the magnitude of the first current and the magnitude of the second current, i.e. the multiplication by the predetermined value, is responsive to a ratio of an area of the non-resistance side transistor to an area of the resistance side transistor in the voltage/current bias circuit.

In stage 1020, a voltage potential at a predetermined point in a current path of the first current of stage 1000 is controlled to be substantially equal to a voltage potential at a predetermined point in a current path of the second current of stage 1010. A voltage control transistor is controlled so that the voltage potentials are substantially equal to each other. A combination of the first and second currents flows through the voltage control transistor. In one embodiment, the voltage potentials are input to a differential amplifier and the output of the differential amplifier controls the magnitude of current flowing through the voltage control transistor.

In stage 1030, a predetermined resistance is provided within the current path of the second current of stage 1010. Optionally, the predetermined resistance is a tunable resistance provided by a tunable resistor. Further optionally, the provided resistance type and value is selected such that the ratio of a voltage across the second transistor to the magnitude of the generated second current of stage 1010 varies less than a predetermined percentage over a predefined temperature range, optionally less than 1% over 125° C. temperature range. The predetermined resistance is provided between the second transistor and the resistance side transistor of stage 1010.

In stage 1040, a third current is generated, the magnitude of the third current being a predetermined function of the magnitude of the second current of stage 1010. Optionally, the magnitude of the third current is substantially equal to the magnitude of the second current. In stage 1050, the third current of stage 1040 is output. In stage 1060, a voltage potential between the second transistor of stage 1010 and the provided resistance of stage 1030 is output.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination. In particular, the invention has been described with an identification of each powered device by a class, however this is not meant to be limiting in any way. In an alternative embodiment, all powered device are treated equally, and thus the identification of class with its associated power requirements is not required.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description.

The invention claimed is:

1. A reference generation circuit comprising:
   a voltage output;
   a current output;
   a voltage/current biasing circuitry;
   a first transistor sourced by a common voltage rail, a gate and drain of said first transistor coupled to a first output of said voltage/current biasing circuitry;
   a second transistor sourced by the common voltage rail, a gate and drain of said second transistor coupled to said voltage output;
   a resistor coupled between said second transistor and a second output of said voltage/current bias circuitry; and
   a third transistor sourced by the common voltage rail, a gate of said third transistor coupled to said voltage output and a drain of said third transistor coupled to said current output,
   wherein said voltage/current bias circuitry is arranged, in cooperation with said first and second transistors, to:
      generate a first current and a first voltage at said first output thereof; and
      generate a second current and a second voltage at said second output thereof, the magnitude of said generated first current equal to the magnitude of said second generated current times a predetermined value, said predetermined value different than one,
   wherein the magnitude of said first voltage equal to the magnitude of said second voltage, and
   wherein the magnitude of a third current flowing through said third transistor is a predetermined function of the magnitude of said generated second current.

2. The reference generation circuit of claim 1, wherein said voltage/current bias circuitry comprises:
   a voltage control transistor;
   a differential amplifier, a first input of said differential amplifier coupled to said first output of said voltage/current bias circuitry, a second input of said differential amplifier coupled to said second output of said voltage/current bias circuitry and an output of said differential amplifier coupled to a gate of said voltage control transistor;
   a non-resistance side transistor coupled between said first output of said voltage/current bias circuitry and said voltage control transistor; and
   a resistance side transistor coupled between said second output of said voltage/current bias circuitry and said voltage control transistor,
   wherein said non-resistance side transistor is arranged, in cooperation with said first transistor, to generate said first current, and
   wherein said resistance side transistor is arranged, in cooperation with said second transistor, to generate said second current, said relationship between said magnitude of said first current and said magnitude of said second current responsive to a ratio of an area of said resistance side transistor to an area of said non-resistance side transistor.

3. The reference generation circuitry of claim 2, wherein a gate of said non-resistance side transistor is coupled to a gate of said resistance side transistor.

4. The reference generation circuitry of claim 1, wherein said resistor comprises a tunable resistor.

5. The reference generation circuitry of claim 1, wherein the resistance of said resistor is selected such that the ratio of a voltage across said second transistor to the magnitude of said second current varies less than a predetermined percentage over a predefined temperature range.

6. The reference generation circuitry of claim 1, wherein a gate of said second transistor is coupled to said voltage output terminal and a gate of said first transistor is coupled between said first transistor and said first output of said voltage/current bias circuitry.

7. A reference generation circuit comprising:
   a voltage/current bias circuitry exhibiting a first output and a second output;
   a current output terminal;
   a first transistor coupled between a common voltage potential and said first output of said voltage/current bias circuitry;
   a second transistor coupled between the common voltage potential and said second output of said voltage/current bias circuitry;
   a third transistor coupled between the common voltage potential and said current output terminal;
   a resistor coupled between said second transistor and said second output of said voltage/current bias circuitry; and
   a voltage output terminal coupled between said resistor and said second transistor, said voltage output terminal further coupled to a gate of said third transistor,
   wherein said voltage/current bias circuitry is arranged, in cooperation with said first and second transistors, to:
      generate a first current and a first voltage at said first output thereof; and
      generate a second current and a second voltage at said second output thereof, the magnitude of said generated first current equal to the magnitude of said second generated current times a predetermined value, said predetermined value different than one,
   wherein the magnitude of said first voltage equal to the magnitude of said second voltage, and
   wherein the magnitude of a third current flowing through said third transistor is a predetermined function of the magnitude of said generated second current.

8. The reference generation circuit of claim 7, wherein said voltage/current bias circuitry comprises:
   a voltage control transistor;
   a differential amplifier, a first input of said differential amplifier coupled to said first output of said voltage/current bias circuitry, a second input of said differential amplifier coupled to said second output of said voltage/current bias circuitry and an output of said differential amplifier coupled to a gate of said voltage control transistor;
   a non-resistance side transistor coupled between said first output of said voltage/current bias circuitry and said voltage control transistor; and
   a resistance side transistor coupled between said second output of said voltage/current bias circuitry and said voltage control transistor,
   wherein said non-resistance side transistor is arranged, in cooperation with said first transistor, to generate said first current, and
   wherein said resistance side transistor is arranged, in cooperation with said second transistor, to generate said second current, said relationship between said magnitude of said first current and said magnitude of said second current responsive to a ratio of an area of said resistance side transistor to an area of said non-resistance side transistor.

9. The reference generation circuitry of claim 8, wherein said gate of said non-resistance side transistor is coupled to said gate of said resistance side transistor.

10. The reference generation circuitry of claim 7, wherein said resistor comprises a tunable resistor.

11. The reference generation circuitry of claim 7, wherein the resistance of said resistor is selected such that the ratio of a voltage across said second transistor to the magnitude of said second current varies less than a predetermined percentage over a predefined temperature range.

12. A reference generation method, the method comprising:
   generating a first current, said generated first current arranged to flow through a first transistor;
   generating a second current, said generated second current arranged to flow through a second transistor, the magnitude of said first current equal to the magnitude of said second current multiplied by a predetermined value, said predetermined value different than one;
   controlling a voltage potential at a predetermined point in a current path of said generated first current to be substantially equal to a voltage potential at a predetermined point in a current path of said generated second current;
   providing a predetermined resistance within the current path of said generated second current;
   generating a third current, the magnitude of said generated third current being a predetermined function of the magnitude of said generated second current;
   outputting said generated third current; and
   outputting a voltage potential between the second transistor and said provided resistance.

13. The method of claim 12, further comprising controlling a voltage control transistor such that said voltage potentials are substantially equal, a combination of said first and second generated currents arranged to flow through said voltage control transistor.

14. The method of claim 12, wherein said generated first current flows through a non-resistance side transistor and said generated second current flows through a resistance side transistor, said relationship between said magnitude of said generated first current and said magnitude of said generated second current responsive to a ratio of an area of the non-resistance side transistor to an area of the resistance side transistor.

15. The method of claim 12, wherein said provided resistance is tunable.

16. The method of claim 12, wherein said provided resistance is selected such that the ratio of a voltage across the second transistor to the magnitude of said generated second current varies less than a predetermined percentage over a predefined temperature range.

* * * * *